(12) United States Patent
Ploessl et al.

(10) Patent No.: US 8,728,937 B2
(45) Date of Patent: May 20, 2014

(54) METHOD FOR PRODUCING SEMICONDUCTOR CHIPS USING THIN FILM TECHNOLOGY

(75) Inventors: Andreas Ploessl, Regensburg (DE); Stephan Kaiser, Regensburg (DE); Volker Härle, Laaber (DE); Berthold Hahn, Hemau (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 865 days.

(21) Appl. No.: 12/684,214

(22) Filed: Jan. 8, 2010

(65) Prior Publication Data

US 2010/0112789 A1 May 6, 2010

Related U.S. Application Data

(62) Division of application No. 11/194,941, filed on Aug. 1, 2005, now Pat. No. 7,649,266.

(60) Provisional application No. 60/592,969, filed on Jul. 30, 2004.

(30) Foreign Application Priority Data

Jul. 30, 2004 (DE) .......................... 10 2004 036 962

(51) Int. Cl.
*H01L 21/44* (2006.01)
(52) U.S. Cl.
USPC ................... 438/670; 438/669; 257/E33.057; 257/E33.063
(58) Field of Classification Search
USPC ............ 438/478, 609, 669, 670; 257/E21.09, 257/E21.214, E33.057, E33.063
See application file for complete search history.

(56) References Cited

U.S. PATENT DOCUMENTS

| 5,463,242 | A | 10/1995 | Castieberry |
| 5,695,847 | A | 12/1997 | Browne |
| 5,724,376 | A | 3/1998 | Kish, Jr. et al. |
| 5,849,130 | A | 12/1998 | Browne |
| 6,066,861 | A | 5/2000 | Hohn et al. |
| 6,111,272 | A | 8/2000 | Heinen |

(Continued)

FOREIGN PATENT DOCUMENTS

| CN | 1262528 | 8/2000 |
| CN | 1426603 | 6/2003 |

(Continued)

OTHER PUBLICATIONS http://www.btechcorp.com/Btech%20SAMPLE%20PAPER.htm, pp. 1-14, Jul. 6, 2004.

(Continued)

*Primary Examiner* — Colleen Matthews
*Assistant Examiner* — Colleen E Snow
(74) *Attorney, Agent, or Firm* — Cozen O'Connor

(57) ABSTRACT

For semiconductor chips using thin film technology, an active layer sequence is applied to a growth substrate, on which a reflective electrically conductive contact material layer is then formed. The active layer sequence is patterned to form active layer stacks, and reflective electrically conductive contact material layer is patterned to be located on each active layer stack. Then, a flexible, electrically conductive foil is applied to the contact material layers as an auxiliary carrier layer, and the growth substrate is removed.

19 Claims, 4 Drawing Sheets

(56) References Cited

U.S. PATENT DOCUMENTS

| | | |
|---|---|---|
| 6,559,075 B1 | 5/2003 | Kelly et al. |
| 6,849,881 B1 | 2/2005 | Harle |
| 6,878,563 B2 | 4/2005 | Bader et al. |
| 6,913,985 B2 | 7/2005 | Ogihara et al. |
| 7,208,337 B2 | 4/2007 | Eisert et al. |
| 7,265,392 B2 | 9/2007 | Hahn et al. |
| 7,399,693 B2 | 7/2008 | Sekiguchi et al. |
| 2002/0017652 A1 | 2/2002 | Illek et al. |
| 2002/0037631 A1 | 3/2002 | Mimata |
| 2004/0026709 A1 | 2/2004 | Bader et al. |
| 2004/0056254 A1 | 3/2004 | Bader et al. |
| 2004/0077114 A1 | 4/2004 | Coman et al. |
| 2004/0099873 A1 | 5/2004 | Illek |
| 2005/0211974 A1* | 9/2005 | Thompson et al. ............ 257/40 |
| 2006/0065905 A1 | 3/2006 | Eisert et al. |
| 2007/0117354 A1* | 5/2007 | Gadkaree et al. ............ 438/478 |
| 2011/0308564 A1* | 12/2011 | Kempa et al. ................ 136/244 |

FOREIGN PATENT DOCUMENTS

| | | |
|---|---|---|
| DE | 199 21 230 A1 | 11/2000 |
| DE | 100 40 448 A1 | 3/2002 |
| DE | 100 59 532 A1 | 6/2002 |
| DE | 103 59 532 B3 | 6/2005 |
| EP | 0 905 797 A2 | 8/1998 |
| JP | 51-045987 | 4/1976 |
| JP | 57-059465 | 4/1982 |
| JP | 63-086578 | 4/1988 |
| JP | 04-313282 | 11/1992 |
| JP | 11-168236 | 6/1999 |
| JP | 2003-534668 | 11/2003 |
| JP | 2004-507094 | 3/2004 |
| JP | 2004-186102 | 7/2004 |
| JP | 2004-521494 | 7/2004 |
| JP | 2005-51117 | 2/2005 |
| JP | 2005-508087 | 3/2005 |
| JP | 2006-12986 | 1/2006 |
| JP | 2006-516066 | 6/2006 |
| KR | 10-2004-0071142 | 8/2004 |
| WO | WO 98/12757 | 3/1998 |
| WO | WO 98/14986 | 4/1998 |
| WO | WO 00/68990 | 11/2000 |
| WO | WO 01/39282 A2 | 5/2001 |
| WO | WO 01/82384 A1 | 11/2001 |
| WO | WO 02/15286 | 2/2002 |
| WO | WO 02/061847 | 8/2002 |
| WO | WO 03/002954 | 1/2003 |
| WO | WO 03/038877 | 5/2003 |
| WO | WO 2004/032247 | 4/2004 |

OTHER PUBLICATIONS http://www.btechcorp.com/atta.htm, pp. 1-4, Jul. 6, 2004.

I. Schnitzer et al., "30% external quantum efficiency from surface textured, thin-film light-emitting diodes", App. Phys. Lett, vol. 63 No. 16, pp. 2174-2176, Oct. 18, 1993.

* cited by examiner

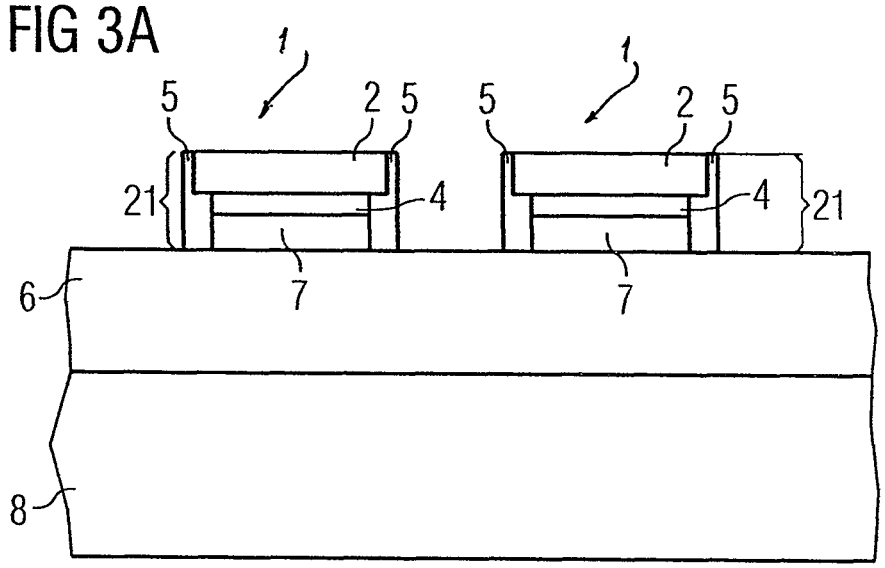
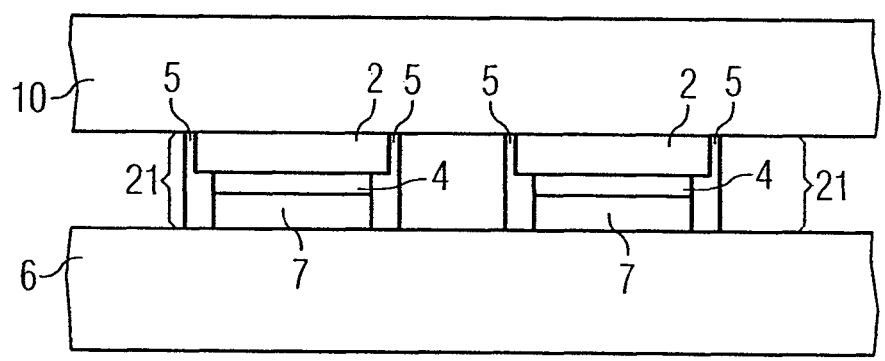
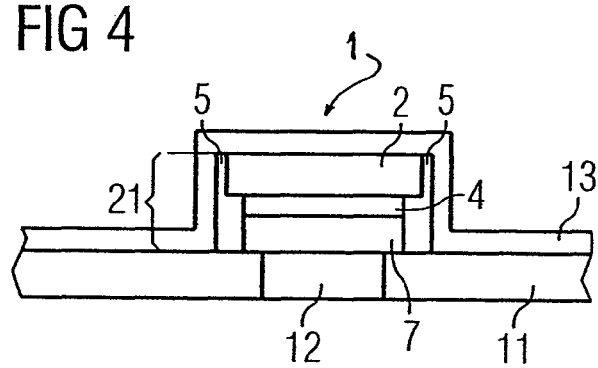

METHOD FOR PRODUCING SEMICONDUCTOR CHIPS USING THIN FILM TECHNOLOGY

CROSS REFERENCE TO RELATED APPLICATIONS

This is a division of U.S. patent application Ser. No. 11/194,941 filed on Aug. 1, 2005, now U.S. Pat. No. 7,649,266, claiming priority to U.S. Provisional Patent Application No. 60/592,969, filed on Jul. 30, 2004, and to German Patent Application No. 10 2004 036 962.3, filed on Jul. 30, 2004, the entire disclosure content of which is hereby incorporated by reference.

FIELD OF THE INVENTION

The invention relates to a method for producing semiconductor chips using thin film technology.

BACKGROUND OF THE INVENTION

Thin film semiconductor chips are known, for example, from U.S. Pat. No. 6,111,272. To produce thin film semiconductor chips of this type, an active layer sequence suitable for emitting photons is grown on a growth substrate. Since the growth substrate generally absorbs some of the photons generated by the active layer sequence, to increase the light yield, the active layer sequence is separated from the growth substrate and applied to a different carrier. There is a reflective layer between the carrier and the active layer sequence. The active layer sequence is joined to the carrier by adhesive bonding or soldering. It is customary to use rigid carriers, such as gallium arsenide or germanium wafers. However, these rigid carriers have the drawback that the thickness of the carrier cannot be reduced to any desired extent, on account of the risk of fracture. In particular, it is difficult to realize carrier thicknesses of less than 100 µm by conventional processes. This represents an obstacle to limiting the overall thickness of thin film semiconductor chips.

A further drawback of the known thin film semiconductor chips is that it is difficult to manage the transfer of the active layer sequence from the growth substrate to the carrier body.

To alleviate this problem, it has been proposed in published US patent application no. 2004/0099873 to apply a reinforcing layer and an auxiliary carrier layer to the back surface of the contact material layers. The reinforcing layer and auxiliary carrying layer replace the mechanical carrier used in conventional methods and allow simplified handling of the active layer sequence. However, with this method it is impossible or only possible with great difficulty to test the function of all subsequent thin film semiconductor chips at wafer level following the transfer of the active layer sequence to the auxiliary carrier.

SUMMARY OF THE INVENTION

It is an object of the present invention to provide a simplified method for producing semiconductor chips with a low overall thickness using thin film technology; the intention is to allow simple wafer level testing of the subsequent thin film semiconductor chips.

The thin film semiconductor chip described in the following embodiments has a low overall size combined, and at the same time, a good mechanical stability.

These and other objects are attained in accordance with one aspect of the present invention directed to a method for producing thin film semiconductor chips comprising the steps of applying an active epitaxial layer sequence, which is suitable for generating electromagnetic radiation, on a growth substrate, forming a reflective electrically conductive contact material layer on the active layer sequence, patterning the active epitaxial layer sequence and the contact material layer to form composite layer stacks, which are separate from one another, on the growth substrate, applying a flexible electrically conductive foil to the contact material layer, and at least partially removing the growth substrate.

Alternatively, the contact material layer can also be applied in a laterally patterned form, for example by means of mask technology, in which case it is possible subsequently for only the active layer sequence below it to be patterned in such a way that there is in each case a contact material layer on an active layer stack. The contact material layer preferably contains a metal.

This method offers the advantage that the back surfaces of the thin film semiconductor chips, which are provided with the contact material layer, are electrically conductively connected to one another via the flexible foil, and consequently each thin film semiconductor chip can easily be tested at wafer level with the aid of in each case one further contact connection on its front surface, which is on the opposite side from the contact material layer.

The use of the electrically conductive flexible foil as an auxiliary carrier layer, offers the advantage that, on account of its high ductility in the event of contaminants (e.g. in the form of particles) between foil and layer composite stack, only a small defect radius is formed around the contaminant. This advantageously allows yield losses caused by contaminants to be reduced.

Furthermore, the use of a flexible foil as carrier allows lower overall thicknesses to be achieved for the thin film semiconductor chips, since the thickness of a flexible foil can be less than that of rigid carriers, with which the risk of fracture generally rises considerably as the thickness is reduced.

The low overall thickness of the thin film semiconductor chips simplifies the subsequent positioning of additional elements on the thin film semiconductor chip within a component housing. These elements may, for example, be wavelength conversion materials which convert the wavelength of radiation emitted by the thin film semiconductor chip. Wavelength conversion materials, as they are known, are described, for example, in U.S. Pat. No. 6,066,861, which is hereby incorporated by reference. It is also conceivable to apply beam-shaping optical elements, such as lenses, directly to the thin film semiconductor chip.

The method according to the invention can be used, for example, to produce thin film light-emitting diode chips ("thin film LED chips" for short).

Such a thin film LED chip comprises a reflective layer applied to or formed on a first main surface, facing a carrier element, of an epitaxial layer sequence which can generate electromagnetic radiation; this reflective layer reflects at least a part of the electromagnetic radiation generated in the epitaxial layer sequence back into the latter; and the epitaxial layer sequence has a thickness in the range of 20 µm or less, in particular in the range of 10 µm.

The epitaxial layer sequence can include at least one semiconductor layer with at least one surface which has a mixing structure, ideally leading to an approximately ergodic distribution of the light in the epitaxial layer sequence, i.e. its stochastic scattering behavior is as far as possible ergodic. A mixing structure is a texture. The surface is preferably textured in an unregular way, such that electromagnetic radiation having one incident angle toward a plane of main extension of said surface is reflected (and optionally scattered) into a plurality of directions. The texture can be achieved, for example, by irregularly roughening the surface, such as by use of etching. Radiation that is reflected back into the epitaxial layer sequence is thus "mixed". "Mixing" refers to the angles of incidence of the radiation. The texture is suitable for "mixing" the electromagnetic radiation, i.e. it is suitable for reflecting a plurality of electromagnetic rays propagating parallel to each other such that after reflection the rays comprise a plurality of different angles of incidence with respect to a plane.

A basic principle of a thin film LED is described, for example, in I. Schnitzer et al., Appl. Phys. Lett. 63 (16), Oct. 18, 1993, 2174-2176, which is hereby incorporated by reference.

A thin film LED chip is a close approximation to a Lambert surface emitter.

A thin film semiconductor chip of this type is, in the present case, preferably based on nitride compound semiconductor material. In the present context, the term "based on nitride compound semiconductors" means that the active epitaxial layer sequence or at least part of it, comprises a nitride III/V compound semiconductor material, preferably $Al_nGa_mIn_{1-n-m}N$, where $0 \leq n \leq 1$, $0 \leq m \leq 1$ and $n+m \leq 1$. This material does not necessarily have to have a precise mathematical composition in accordance with the formula given above. Rather, it may include one or more dopants and additional constituents which leave the characteristic physical properties of the $Al_nGa_mIn_{1-n-m}N$ material substantially unchanged. For the sake of simplicity, however, the above formula includes only the main constituents of the crystal lattice (Al, Ga, In, N), although these constituents may be partially replaced by small quantities of further substances.

In one embodiment of the method according to the invention, the flexible, electrically conductive foil is a carbon foil, as is known, for example, from documents U.S. Pat. Nos. 5,695,847 and 5,849,130, which are hereby incorporated by reference.

In addition to a low price, this carbon foil is advantageously also distinguished in particular by a high thermal and electrical conductivity and a low thickness. Furthermore, the carbon foil has the advantage that it can be joined to the layer composite comprising the epitaxial layer sequence and the contact material layer by the application of relatively low pressure and temperature. This reduces the risk of damage to the active layer stack during the joining step. Moreover, thin film semiconductor chips which include a carbon foil as the bottom layer can easily be installed in a housing and electrically contact-connected in a conventional way. The high thermal conductivity of the carbon foil advantageously allows effective dissipation of the heat which is generated when a thin film semiconductor chip is operating.

The thickness of the electrically conductive foil is preferably less than 100 µm. Since the foil is flexible, unlike a rigid carrier, it is possible to achieve such low carrier thicknesses.

To protect the thin film semiconductor chip from corrosion, it is possible for a passivation layer, which contains silicon nitride, to be applied at least to parts of the side faces of the layer composite stacks which are uncovered during the patterning operation. In addition to its protective function, the passivation layer can also perform further tasks, such as, for example, to provide electrical insulation.

In another embodiment of the method according to the invention, an electrically conductive reinforcing layer which contains, for example, a metal, is applied to the reflective electrically conductive contact material layer. This reinforcing layer serves to stabilize the active layer sequence and, moreover, allows subsequent electrical contact connection of the thin film semiconductor chips via the back surface.

In a further embodiment, a rigid auxiliary carrier can be joined to the flexible, electrically conductive foil before the growth substrate is removed. This additional rigid auxiliary carrier strengthens the layer composite, so that the latter can be introduced into standard test systems or process installations and treated at wafer level.

The use of a carbon foil as joining layer between the layer composite and the rigid auxiliary carrier particularly offers the advantage of being compatible with many processing technologies. For example, the carbon foil, unlike, for example, layers of adhesive, does not release any possibly harmful gaseous substances to the environment in vacuum.

After the growth substrate has been removed, further electrically conductive contact layers can in each case be applied in a conventional way to that side of the active layer stacks which was previously located on the growth substrate. These further electrically conductive contact layers comprise, for example, a metal. These further contact layers in each case represent the second electrical contact location of each thin film semiconductor chip, to which, for example, a bonding wire can be applied.

Furthermore, it is preferably possible for an intermediate carrier to be applied to the second electrically conductive contact locations, and for the flexible electrically conductive foil to be removed. The thin film semiconductor chips are then fixed separately from one another on the intermediate carrier, from which they can easily be picked up and put in place, for example, using conventional pick-and-place machines. The intermediate carrier may be a further foil, e.g. a sawing foil. Semiconductor chips joined to the wafer are fixed to a sawing foil of this type, for example, before they are separated by means of a wafer saw. A "sawing foil" is a foil that is suitable for applying a layer stack for semiconductor chips on it and dividing the layer stack into a plurality of semiconductor chips by means of sawing. Such a foil is preferably flexible. It can be made of or comprise synthetic material. It is particularly preferable for a sawing foil to have an adhesive surface onto which the layer stack can be applied and, thus, be fixed to the sawing foil. As a result, the semiconductor chips stick to the sawing foil after sawing.

The side faces of the thin film semiconductor chips may preferably also be provided with the passivation layer for the entire surface. This is expediently done after the electrically conductive foil has been joined to the rigid auxiliary carrier and the growth substrate has been detached. The rigid auxiliary carrier then stabilizes the layer composite in such a manner that the latter can be provided with the passivation layer in standard processing installations.

The thin film semiconductor chips are then expediently likewise separated by applying a further intermediate carrier, for example, a foil or sawing foil, to that side of the active layer stack originally joined to the growth substrate and removing the flexible, electrically conductive foil.

Another aspect of the present invention is directed to a thin film semiconductor chip comprising an active layer sequence which is suitable for generating electromagnetic radiation, an electrically conductive, reflective contact material layer on the active layer sequence, and a flexible, electrically conductive foil as carrier layer on the electrically conductive, reflective contact material layer.

A thin film semiconductor chip of the type disclosed herein offers the advantage of having a low overall thickness, preferably less than 150 µm and in particular less than 100 µm. Therefore, it can be installed in a housing without an increased risk of fracture. On account of the low overall thickness, a thin film semiconductor chip of this type is particularly suitable for installation in a housing of very small dimensions together with wavelength conversion material.

Furthermore, a thin film semiconductor chip of this type can easily be electrically contact-connected on the back surface via the flexible, electrically conductive foil.

The use of a flexible foil at the same time reduces the risk of fracture during handling and placing of the thin film semiconductor chip.

In one embodiment, the flexible, electrically conductive foil is a carbon foil. This is distinguished by particularly high electrical and thermal conductivities and a low price.

In a further embodiment, an electrically conductive reinforcing layer is located on the electrically conductive reflective contact material layer. This reinforcing layer is used to further reinforce the active layer sequence and simultaneously allows back surface contact connection of the thin film semiconductor chip via the flexible, electrically conductive foil.

Both the reflective electrically conductive contact material layer and the electrically conductive reinforcing layer preferably contain a metal.

Furthermore, the side faces of the thin film semiconductor chip according to an embodiment of the invention are provided with a passivation layer over the entire surface. A thin film semiconductor chip of this type is particularly suitable for electrical contact connection without a bonding wire. For example, a thin film semiconductor chip of this type can be contact-connected on the back surface by being applied to an electrical connection conductor which is located, for example, on a chip carrier or is itself designed as a chip carrier (for example, a leadframe). The thin film semiconductor chip can then be contact-connected on the front surface by an electrically conductive layer which is applied to the entire surface or in patterned form and expediently allows good transmission of the electromagnetic radiation emitted by the thin film semiconductor chip.

DETAILED DESCRIPTION OF THE DRAWINGS

In the exemplary embodiments and figures, identical or equivalent parts are each provided with the same reference designations. The elements illustrated in the figures, in particular the sizes of layer thicknesses and layer thickness ratios illustrated, are fundamentally not to scale. Rather, they may in some cases be illustrated in exaggerated form in order to improve understanding.

Exemplary Embodiment 1

Figure 1A:
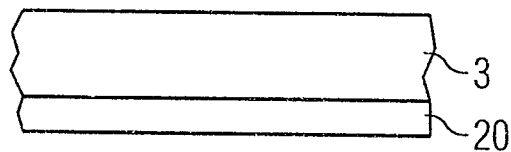
FIGS. 1A to 1F diagrammatically depict an exemplary embodiment of the method on the basis of diagrammatic sectional illustrations through a wafer composite at various stages of the method, FIGS. 2A to 2C diagrammatically depict a further exemplary embodiment of the method on the basis of diagrammatic sectional illustrations through a wafer composite at various stages of the method, FIGS. 3A and 3B diagrammatically depict yet another exemplary embodiment of the method on the basis of diagrammatic sectional illustrations through a wafer composite at various stages of the method, and FIG. 4 diagrammatically depicts a section through a thin film semiconductor chip according to the invention which has been applied to a chip carrier and electrically contact-connected.

In a method in accordance with Exemplary Embodiment 1, in a first step, an active layer sequence 20 is applied to a growth substrate 3 (FIG. 1a). In one embodiment, this is done, for example by epitaxial growth of a plurality of different layers of nitride III/V compound semiconductor material, preferably comprising the system $Al_nGa_mIn_{1-n-m}N$, where $0 \leq n \leq 1$, $0 \leq m \leq 1$ and $n+m \leq 1$, on a sapphire or SiC substrate. Of course, this does not rule out the possibility of the composition containing further elements in addition to In, Al and/or Ga and N.

An active layer sequence of this type which is suitable for generating electromagnetic radiation may, for example, have a conventional pn junction, a doublehetero structure, a single quantum well structure (SQW structure) or a multiple quantum well structure (MQW structure). Structures of this type are known to the person skilled in the art and are not, therefore, explained in more detail at this point. A suitable quantum well structure is known, for example, from U.S. Pat. No. 6,849,881, which is hereby incorporated by reference.

Figure 1B:
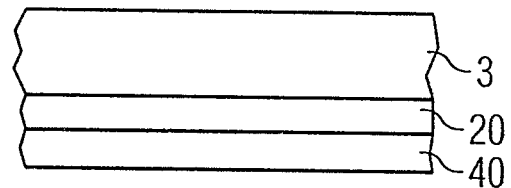
Figure 1C:
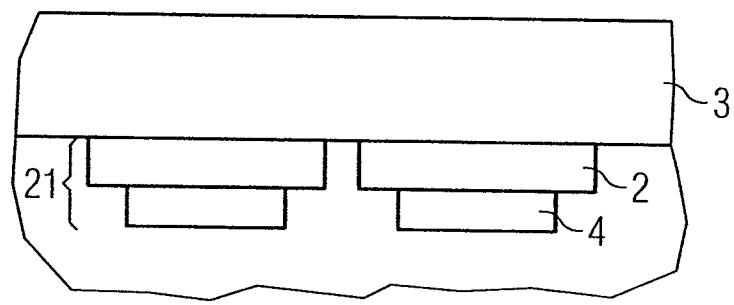
Figure 1D:
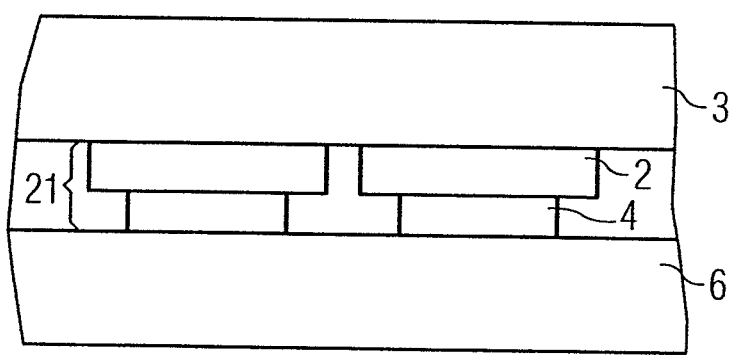

Then, an electrically conductive reflective contact material layer 40 is formed on the active layer sequence 20 (FIG. 1b). In a subsequent thin film semiconductor chip 1, this contact material layer 40 serves the purpose, inter alia, of reflecting radiation which is emitted by the active layer sequence 20 toward this contact material layer 40 toward the opposite output side of the thin film semiconductor chip 1, in order to increase the radiation yield.

The contact material layer 40 may contain a metallic material such as Ag, Al or Au, which has been applied by evaporation coating, over its entire surface. Furthermore, it is possible to use dielectric reflectors which comprise a plurality of dielectric layers with integrated electrical contacts.

Examples of suitable reflectors are known, for example, from U.S. Pat. No. 6,878,563, which is hereby incorporated by reference.

At the same time, the contact material layer 40 functions as a back surface contact material layer for the active layer sequence 20. The active layer sequence 20 and the reflective electrically conductive contact material layer 40 together have a thickness of, for example, 8 μm.

In a subsequent step, separate composite layer stacks 21 each comprising an electrically conductive reflective contact material layer 4 and an active layer stack 2, are formed from the layer composite comprising active layer sequence 20 and contact material layer 40 on the growth substrate 1 by patterning. The patterning is done, for example, by wet chemical etching or by dry etching.

A multitude of composite layer stacks 21 are formed, the active layer stacks being separate from one another. Formation of the active layer stacks includes patterning the active layer sequence and patterning the contact material layer. Patterning of the active layer sequence and patterning of the contact material layer do not necessarily have to be conducted simultaneously. It is possible to first apply the contact material layer in a patterned form, i.e. the contact material layer is applied and patterned at the same time. Also, application and patterning of the contact material layer can be conducted before or after patterning of the active layer sequence.

The following possibilities exist to achieve separated composite layer stacks 21:

1. a) Epitaxial growth of the active layer sequence on a wafer level, which means over the whole wafer in a non-patterned manner;
   b) applying the contact material layer on wafer level;
   c) patterning the contact material layer; and
   d) patterning the active layer sequence.

2. a) Epitaxial growth of the active layer sequence on a wafer level;
   b) patterning the active layer sequence to form active layer stacks; and
   c) applying the contact material layer in a patterned manner;

Applying the contact material layer in a patterned manner would be done for example by a lift-off technique. That means that a mask, such as a photoresist mask, with the desired pattern is applied on the active layer stacks. Then, the contact material layer is applied on the mask over the whole wafer. In a next step, the mask is removed (for example by dissolving the mask material in a suited solvent). By removing the mask, the corresponding regions of the contact material layer are removed simultaneously such that the pattern of the mask is transferred in the contact material layer. Such a lift-off process is well known by a person ordinarily skilled in the art.

In this implementation of the invention, the contact material layer can be applied on a wafer level during the lift-off process and patterned by removing the mask.

Applying the contact material layer directly in a patterned manner, e.g. by means of a shadow mask, is quite unlikely, since the resolution is inadequate.

3. a) Epitaxial growth of the active layer sequence on a wafer level;
   b) applying the contact material layer on a wafer level; and
   c) patterning the contact material layer and the active layer stack simultaneously.

Then, a flexible, electrically conductive foil 6 is applied to the electrically conductive reflective contact material layers 4. This may, for example, be a carbon foil with a thickness of between 30 and 80 µm.

The carbon foil offers the advantage that it can be joined to the composite layer stacks 21 at temperatures of ≤150° C. and at a relatively low pressure (approx. 1 bar).

To carry out this joining process, the carbon foil can be applied to a holder. To ensure that the carbon foil does not also become joined to this holder during the process, it is possible for example, to introduce a nonstick film, e.g. of Teflon, between the holder and carbon foil. Of course, a nonstick film of this type can also be used during the joining method at other locations at which there is a risk of the carbon foil unintentionally being joined to other surfaces.

Figure 1E:
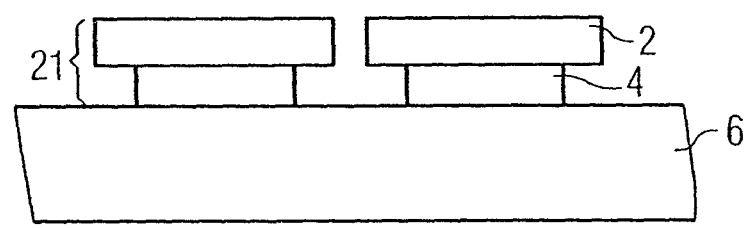

In a subsequent step, the growth substrate 3 on which the active layer sequence 20 was grown is removed, e.g. by a laser lift-off method, as described, for example, in U.S. Pat. No. 6,559,075. As illustrated in FIG. 1E, the active layer stacks 2 with a back surface reflective electrically conductive contact-connection layer 4 are now located next to one another on the flexible, electrically conductive foil 6.

Figure 1F:
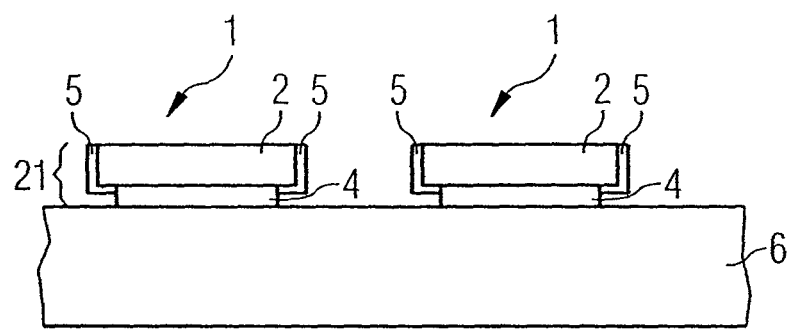

As an additional step, following the patterning of the composite layer stack 21, a passivation layer 5 can be at least partially formed on the side faces of the composite layer stacks 21, as illustrated in FIG. 1F. This passivation layer may consist, for example, of silicon nitride, aluminum oxide, aluminum nitride or silicon oxynitride.

The thin film semiconductor chips 1 can be separated by separating the foil (6) with the aid of conventional methods, such as laser cutting, water jet cutting or sawing.

Thin film semiconductor chips 1 which have been provided with a carbon foil 6 on the back surface can be mounted easily in a housing by means of the carbon foil 6 by the application of pressure and temperature. Alternatively, a thin film semiconductor chip 1 of this type can be joined to a housing by adhesive bonding.

Exemplary Embodiment 2

The first three method steps, namely production of the active layer sequence 20, application of an electrically conductive contact material 40 and patterning of these two layers to form composite layer stacks 21 are carried out in the same way as in Exemplary Embodiment 1. Unlike in Exemplary Embodiment 1, then a further electrically conductive reinforcing layer 7 is applied to the contact material layer 4 of the composite layer stack 21, so that the latter now includes at least three layers. The electrically conductive reinforcing layer 7 may consist, for example, of a metallic material, applied by electroplating.

The thickness of the active layer stack 2 together with the reflective electrically conductive contact material layer 4 and the metallic reinforcing material layer 7 is, for example, between 20 µm and 25 µm.

Figure 2A:
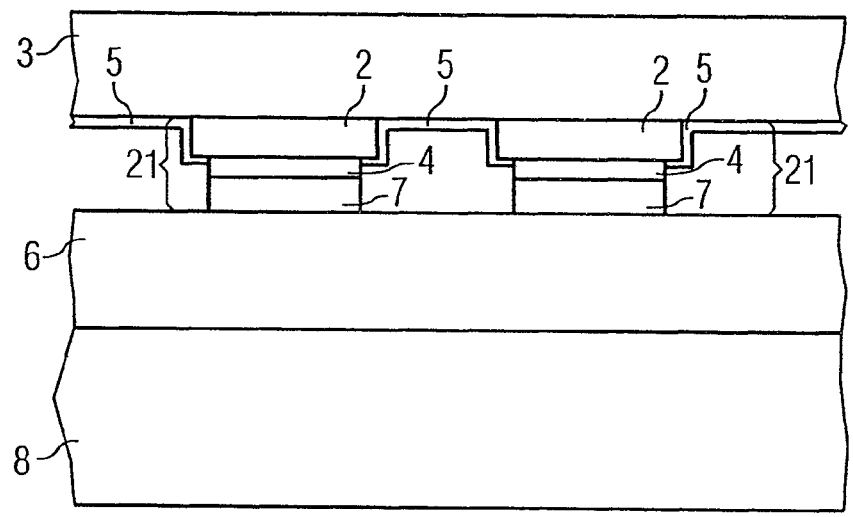

After the active layer sequence 20 and the reflective electrically conductive contact material layer 40 have been patterned to form separate composite layer stacks 21 and the metallic reinforcing material layer 7 has been applied, a passivation layer 5 is applied to the uncovered side faces of the active layer stacks 2, and a carbon foil 6 is applied to the metallic reinforcing layers 7 assigned to the composite layer stacks 21 (FIG. 2A).

To further reinforce the layer composite formed in this way, a further rigid stable auxiliary carrier 8, the thickness of which is, for example, between 100 and 150 µm, can in turn be applied to the back surface of the carbon foil 6 by the application of pressure and temperature. It is also possible to use thicker carriers.

This rigid auxiliary carrier 8 allows simplified handling of the layer composite and further processing of the layer composite in conventional LED manufacturing installations. Moreover, if the rigid auxiliary carrier consists of an electrically conductive material, such as, for example, molybdenum, tantalum or tungsten, the subsequent thin film semiconductor chips 1 can still be electrically contact-connected on the back surface at wafer level. This allows testing of all the thin film semiconductor chips 1 which have been produced on a wafer in conventional measurement equipment.

Figure 2B:
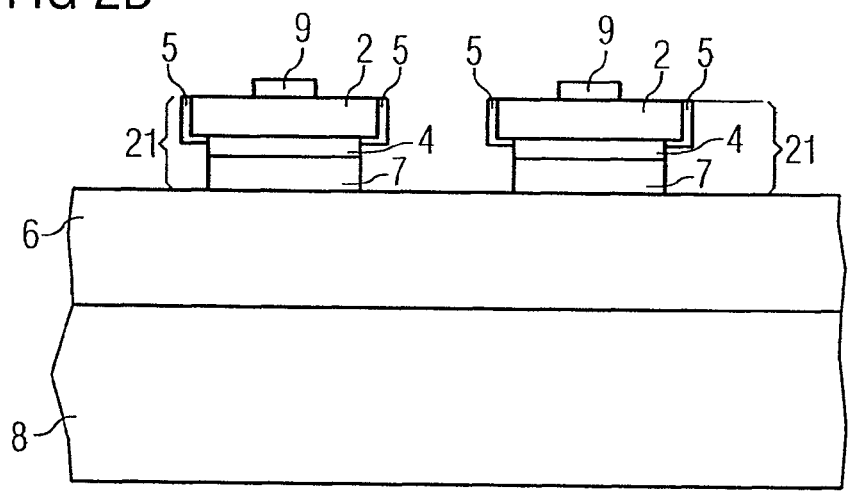

In a further step, the growth substrate 3 is removed (FIG. 2b), and electrically conductive metallic contact locations 9 are formed on the front surfaces of the active layer stacks 2, which had previously been joined to the growth substrate 1. These contact locations 9 may, for example, contain Ag, Au or Al applied by evaporation coating.

Then, all the thin film semiconductor chips 1, in each case comprising active layer stack 2, electrical contact material layer 4, reinforcing layer 7, carbon foil 6 and contact location 9, can be tested while still joined to the wafer in conventional test systems.

Figure 2C:
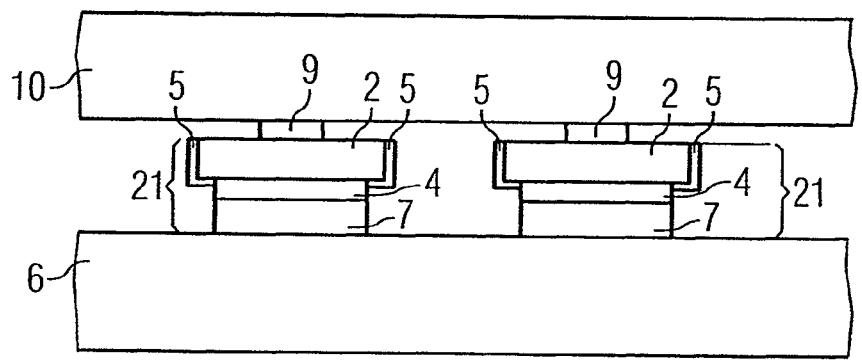

As illustrated in FIG. 2C, it is then possible for an intermediate carrier 10 to be applied to the front surfaces of the electrically conductive contact locations 9. This intermediate carrier 10 may be a foil, as is also used when sawing wafers. The thin film semiconductor chips 1 can be removed from the rigid auxiliary carrier 8 and simultaneously divided up by selective removal of the carbon foil 6, for example by wet-chemical means. The individual thin film semiconductor chips 1 on the intermediate carrier 10 are then available for conventional further processing, for example, mounting on leadframes and/or housing bodies.

Exemplary Embodiment 3

As described in Exemplary Embodiments 1 and 2, composite layer stacks 21 joined to the wafer are produced; each of these composite layer stacks 21 includes an active layer stack 2 with a reflective electrically conductive contact material layer 4, and optionally a further electrically conductive reinforcing layer 7 thereon. After removal of the growth substrate 3, these layer composite stacks 21 are located on the electrically conductive foil 6, which can be joined to a rigid auxiliary carrier 8.

As shown in FIG. 3A, the passivation layer 5 can also be applied to the entire surface of the sides of the subsequent thin film semiconductor chips 1 comprising the active layer stacks 2, the reflective electrically conductive contact material layer 4 and the metallic reinforcing layer 7.

For this purpose, it is expedient for the passivation layer 5 to be applied after the composite layer comprising active layer stack 2, reflective electrically conductive contact material layer 4 and optional metallic reinforcing layer 7 has been joined to a rigid auxiliary carrier 8 via the carbon foil 6. The thin film semiconductor chips 1 can then be separated by selective removal of the carbon foil 6. The thin film semiconductor chip 1 then has complete lateral insulation. An additional passivation step can therefore be dispensed with. A step of this type usually has to be carried out on thin film semiconductor chips 1 produced by standard methods.

FIG. 3A shows thin film semiconductor chips 1 with a passivation layer 5 over the whole of the side face on a flexible electrically conductive foil 6 joined to a rigid stable auxiliary carrier 8. If the rigid auxiliary carrier 8 consists of an electrically conductive material, such as for example molybdenum, FIG. 3A again shows the state in which the subsequent thin film semiconductor chips 1 of this embodiment can be tested simultaneously.

FIG. 3B shows thin-film semiconductor chips 1 with a passivation layer 5 over the whole of the side face and an intermediate carrier 10 applied to the surface. As already described in connection with FIG. 2C, the thin film semiconductor chips 1 can be removed again from the rigid auxiliary carrier 8 and simultaneously divided up by selective removal of the carbon foil 6, for example, intermediate carrier 10 are then available for conventional further processing, for example, mounting on leadframes and/or housing bodies.

Exemplary Embodiment 4

FIG. 4 illustrates a thin film semiconductor chip 1 which comprises an active layer stack 2 with, on its back surface, a reflective electrically conductive contact material layer 4, which is in turn reinforced by a metallic reinforcing layer 7. The sides of the thin film semiconductor chips 1 are in this case covered over the entire surface with a passivation layer 5.

A thin film semiconductor chip 1 of this type is particularly suitable for electrical contact connection without a bonding wire after it has been applied to a suitable chip carrier 11.

For this purpose, the thin film semiconductor chip 1 is applied to a suitable chip carrier 11 such as, for example, a printed circuit board. The latter expediently includes electrically conductive structures 12 for the back surface contact connection of the subsequent thin film semiconductor chip, while the remainder of the chip carrier 11 consists of an electrically insulation material, such as for example a plastic. The thin film semiconductor chips are positioned on the electrically conductive structures 12 of the chip carrier 11 and are then electrically contact-connected by application of an electrically conductive layer 13 over the entire surface of the thin film semiconductor chip 1 and to the surface of the chip carrier 11. This electrically conductive layer 13 expediently consists of a material which has a high transmission coefficient for the electromagnetic radiation emitted by the thin film semiconductor chip, such as for example indium tin oxide (ITO) or zinc oxide.

It should be noted at this point that this contact connection method, in which there is no need for a bonding wire, is considered an independent invention.

For the sake of completeness, it should be noted that the invention is not, of course, restricted to the exemplary embodiments, but rather the scope of the invention encompasses all embodiments which are based on its basic principle explained in the general part of the specification. At the same time, it should be noted that the various elements of the different exemplary embodiments can be combined with one another without departing from the basic concept of the invention.

We claim:

1. A method for producing thin film semiconductor chips, the method comprising the steps:
    applying an active layer sequence, which is suitable for generating electromagnetic radiation, on a growth substrate;
    forming a reflective electrically conductive contact material layer on the active layer sequence;
    patterning the active layer sequence and the contact material layer to form active layer stacks, which are separate from one another, on the growth substrate;
    applying a flexible electrically conductive foil to the reflective electrically conductive contact material layer; and
    at least partially removing the growth substrate,
    wherein said electrically conductive foil is a carbon foil.

2. The method of claim 1, wherein said electrically conductive foil has a thickness equal to or less than 100 µm.

3. The method of claim 1, wherein the electrically conductive contact material layer contains a metal.

4. The method of claim 1, further comprising forming a passivation layer at least on parts of side faces of the active layer stacks which are uncovered during the patterning step.

5. The method of claim 1, further comprising applying an electrically conductive reinforcing layer to the reflective electrically conductive contact material layer.

6. The method of claim 5, wherein the electrically conductive reinforcing layer contains a metal.

7. The method of claim 1, further comprising, prior to removing the growth substrate, joining a rigid auxiliary carrier to the flexible electrically conductive foil.

8. The method of claim 1, wherein, after removing the growth substrate, applying electrically conductive contact locations to a side of the active layer sequence of the active layer stacks on which the growth substrate was previously located.

9. The method of claim 8, wherein the electrically conductive contact locations contain a metal.

10. The method of claim 8, further comprising applying an intermediate carrier to the electrically conductive contact locations, and removing the flexible electrically conductive foil so that separated thin film semiconductor chips are present on the intermediate carrier.

11. The method of claim 10, wherein the intermediate carrier used is a further foil.

12. The method of claim 10, further comprising applying a passivation layer to an entire area of side faces of the active layer stacks.

13. The method of claim 8, further comprising, following removal of the growth substrate, applying an intermediate carrier to the side of the active layer stacks on which the growth substrate was previously located, and then removing the flexible, electrically conductive foil, so that the thin film semiconductor chips are located separated on the intermediate carrier.

14. The method of claim 13, wherein the intermediate carrier is a further foil.

15. A method for producing thin film semiconductor chips, the method comprising the steps of;
   applying an active layer sequence, which is suitable for generating electromagnetic radiation, on a growth substrate;
   forming a reflective electrically conductive contact material layer on the active layer sequence;
   forming composite layer stacks separated from each other on the growth substrate, each of the composite layer stacks comprising a part of the active layer sequence and a part of the reflective electrically conductive contact material layer;
   applying a flexible electrically conductive foil to the reflective electrically conductive contact material layer;
   at least partially removing the growth substrate; and
   prior to the removal of the growth substrate, joining a rigid auxiliar carrier to the flexible electrically conductive foil.

16. The method of claim 15, wherein said electrically conductive foil is a carbon foil.

17. The method of claim 15, further comprising applying an electrically conductive reinforcing layer to the reflective electrically conductive contact material layer.

18. A method for producing thin film semiconductor chips, the method comprising the steps:
   applying an active layer sequence, which is suitable for generating electromagnetic radiation, on a growth substrate;
   forming a reflective electrically conductive contact material layer on the active layer sequence;
   patterning the active layer sequence and the contact material layer to form active layer stacks, which are separate from one another, on the growth substrate;
   applying a flexible electrically conductive foil to the reflective electrically conductive contact material layer;
   at least partially removing the growth substrate; and
   prior to removing the growth substrate, joining a rigid auxiliary carrier to the flexible electrically conductive foil.

19. A method for producing thin film semiconductor chips, the method comprising the steps of
   applying an active layer sequence, which is suitable for generating electromagnetic radiation, on a growth substrate;
   forming a reflective electrically conductive contact material layer on the active layer sequence;
   forming composite layer stacks separated from each other on the growth substrate, each of the composite layer stacks comprising a part of the active layer sequence and a part of the reflective electrically conductive contact material layer;
   applying a flexible electrically conductive foil to the reflective electrically conductive contact material layer; and
   at least partially removing the growth substrate,
   wherein said electrically conductive foil is a carbon foil.

* * * * *